United States Patent
Schimpe

[19]

[11] Patent Number: 5,940,569

[45] Date of Patent: Aug. 17, 1999

[54] INTEGRATED OPTICAL ELEMENT ON A SUBSTRATE OF INP

[75] Inventor: Robert Schimpe, Riemerling, Germany

[73] Assignee: Siemens Aktiengesellschaft, Munich, Germany

[21] Appl. No.: 08/894,854

[22] PCT Filed: Feb. 26, 1996

[86] PCT No.: PCT/DE96/00317

§ 371 Date: Aug. 28, 1997

§ 102(e) Date: Aug. 28, 1997

[87] PCT Pub. No.: WO96/27146

PCT Pub. Date: Sep. 6, 1996

[30] Foreign Application Priority Data

Feb. 28, 1995 [DE] Germany ............................ 195 06 960

[51] Int. Cl.$^6$ ...................................................... G02B 6/10
[52] U.S. Cl. ........................... 385/131; 385/129; 359/246; 437/105; 257/95
[58] Field of Search ................................. 385/131, 2, 129, 385/130, 132, 133; 359/246, 282; 257/95; 437/105

[56] References Cited

U.S. PATENT DOCUMENTS

| 5,245,465 | 9/1993 | Tomita et al. ............................ 259/246 |
| 5,334,551 | 8/1994 | Komatsu .................................. 437/105 |
| 5,455,433 | 10/1995 | Komatsu .................................. 257/95 |
| 5,757,985 | 5/1998 | Ishizaka ...................................... 385/2 |

FOREIGN PATENT DOCUMENTS

| 0 420 749 | 4/1991 | European Pat. Off. . |
| 0 447 096 | 9/1991 | European Pat. Off. . |
| 0 457 571 | 11/1991 | European Pat. Off. . |
| 0 612 129 | 8/1994 | European Pat. Off. . |
| 2 207 283 | 1/1989 | United Kingdom . |

OTHER PUBLICATIONS

Magari et al, "Polarization–Insensitive Optical Amplifier with Tensile–Strained–Barrier MQW Structure", *IEEE Journal of Quantum Electronics,* vol. 30, No. 3, Mar. 1994, pp. 695–702.

Newkirk et al, "1,5 μm Multiquantum–Well Semiconductor Optical Amplifier with Tensile and Compressively Strained Wells for Polarization–Independent Gain", *IEEE Photonics Technology Letters,* vol. 4, No. 4, Apr. 1993, pp. 406–408.

Thijs et al, "Progress in Long–Wavelength Strained–Layer InGaAs(p) Quantum–Well Semiconductor Lasers and Amplifiers", *IEE Journal of Quantum Electronics,* vol. 30, No. 2, Feb. 1994, pp. 477–499.

Holtmann et al, "Polarization Insensitive Bulk Ridge–type Semiconductor Optical Amplifiers at 1.3 μm Wavelength", *Conference Optical Amplifiers and Their Applications,* Yokohama, Japan, Jul. 4–6, 1993, Paper SuB 2–1, pp. 8–11 (1993).

Tiemeijer et al, "High Performance 1300nm Polarization Insensitive Laser Amplifiers Employing both Tensile and Compressively Strained Quantum Wells in a Single Active Layer", *Proc. Europ. Conf. Opt. Commun. '92 (ECOC'92),* Pt. 3, Berlin, 1992, pp. 911–913.

*Primary Examiner*—Phan T.H. Palmer
*Attorney, Agent, or Firm*—Hill & Simpson

[57] ABSTRACT

An optical fiber of the type makes it possible to guide light waves independently of their polarization at 1.55 μm wavelength. The optical layer (12) and semiconductor material (11, 12) adjacent to both flat sides (121, 122) of the layer (12) have a crystal lattice constant (1) less than 1% lower than a determined crystal lattice constant (a1) of InP. In a preferred embodiment of the invention, a superlattice is provided on an InP substrate to widen the InP lattice constants.

14 Claims, 1 Drawing Sheet

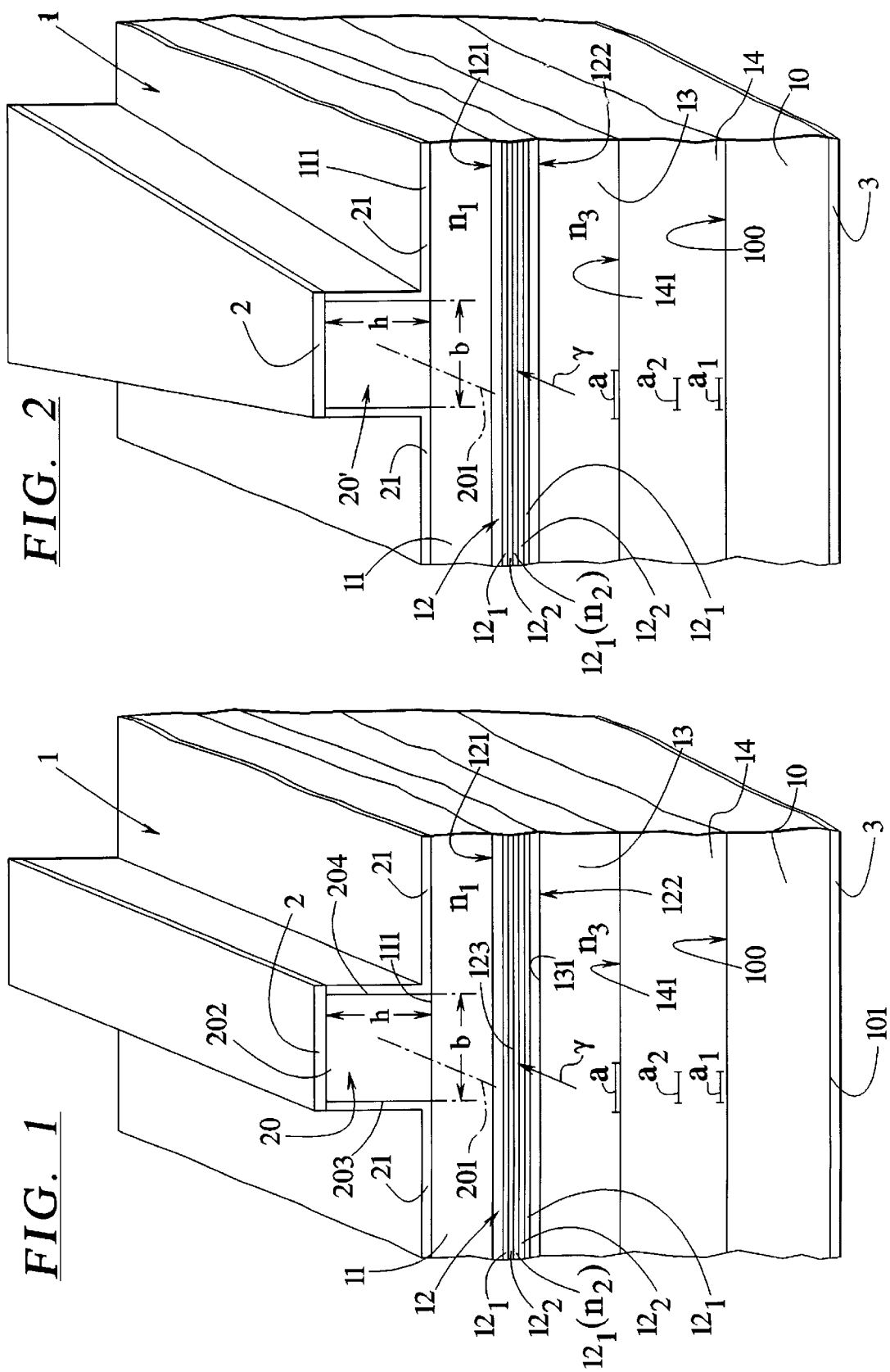

INTEGRATED OPTICAL ELEMENT ON A SUBSTRATE OF INP

BACKGROUND OF THE INVENTION

The invention relates to an integrated optical element on a substrate on InP which element comprises a waveguiding layer of a specific, complex refractive index being interposed between two layers of semiconductor material having real refractive indices with one of the two layers being on the substrate, the complex refractive index of the waveguiding is controllable with electric charge carriers and exhibits a real part that is greater than the real refractive index of the two layers so that the light of a specific wavelength can be coupled into the waveguide layer and guided therein and the waveguiding layer exhibits a crystal lattice constant that is less than one percent greater than a specific lattice constant of the InP and the element includes means for controlling the complex refractive index of the waveguiding layer so that the intensity and/or phase of the light being guided in the waveguiding layer is variable.

An integrated optical element of said species is disclosed by the document GB-A-2 207 283 in which five different examples of integrated optical elements on a substrate of InP are described.

What all of these examples have in common is that the layers of ternary material adjoining the waveguiding layer are composed of such a composition that these layers exhibit the same crystal lattice constant as the InP of the substrate.

In two examples, the waveguiding layer is composed of three adjacent, thin layers at which the layers adjacent to the waveguiding layer adjoin. These outer, thin layers each respectively exhibit a crystal lattice constant that gradually increases in the direction toward the central thin layer from the relatively lower crystal lattice constant of the layers adjacent to the waveguiding layer to the relatively higher crystal lattice constant of the central, thin layers.

In one of these two latter examples, the relatively higher crystal lattice constant of the central thin layer is only 0.5% higher than the crystal lattice constant of the InP of the substrate.

An integrated optical element on a substrate of InP composed of
a waveguiding layer of a specific, complex refractive index and
two layers of semiconductor material each respectively exhibiting a real refractive index between which the waveguiding layer is arranged, that adjoin the waveguiding layer and whereof one is located between the waveguiding layer and the substrate, whereby
the complex refractive index of the waveguiding layer is controllable with electrical charge carriers and exhibits a real part that is respectively greater than the real refractive index of the two layers adjoining the waveguiding layer, whereby
light of a specific wavelength can be coupled into the waveguiding layer and the in-coupled light is guided essentially in the waveguiding layer, and whereby
a means is provided for the control of the complex refractive index in the waveguiding layer such that the intensity and/or phase of the light guided in the waveguiding layer is variable, proceeds from the following documents:
a) K. Magari et al.: "Polarization-insensitive optical amplifier with tensile-strained-barrier MQW structure", IEEE J. Quantum Electr., Vol. Qe-30, No. 3 (1994) pp. 695–702, from
b) M. A. Newkirk et al.: "1.5 µm Multi-quantum-well semiconductor optical amplifier with tensile and compressively strained wells for polarization-independent gain", IEEE Photon. Technol. Lett., Vol. PTL-4, No. 4, 1993, pp. 406–408, from
c) P. J. A. Thijs et al.: "Progress in long-wavelength strained-layer InGaAs (P) quantum-well semiconductor lasers and amplifiers", IEEE J. Quantum elektron. Vol. QE-30, No. 2 (1994), pp. 477–499 from
d) Ch. Holtmann et al "Polarization-insensitive bulk ridge-type semiconductor optical amplifiers at 1.3 µm wavelength", Yokohama, Japan, Jul. 4–6, 1993, Paper Sub 2-1, pp. 8–11 (1993) or also from
e) Tiemeijer et al.: "High Performance 1300 nm Polarisation insensitive laser amplifiers employing both tensile and compressively strained quantum wells in a single active layer" Proc. Europ. Conf. Opt. Commun. '92 (ECOC'92), Pt. 3, Berlin, 1992, pp. 911.

Each of the waveguides described in these documents a) through e) forms a waveguide in the form of a polarization-independent optical amplifier.

In the case of the amplifier described in document a), the wave-guiding layer has quantum well layers in the form of weakly tensile-strained potential wells or potential barriers. Wealky tensile-strained wells require relatively high current because of "valence band mixing". Quantum wells with tensile-strained barriers require large thicknesses, which are difficult to manufacture because of the strain and which move structures into the range of conventional layered structures without a quantization effect.

In the case of the waveguides described in document b) and c), the wave-guiding layer has quantum well layers in the form of potential wells which are alternately tensile-strained and compression-strained. Such quantum well layers have been successfully implemented in optical amplifiers for a wavelength of 1.3 µm.

The waveguide described in document d) is a ribbed waveguide whose wave-guiding layer has a homogenous composition of InGaAsP with a gap wavelength of 1.3 µm and a thickness between 150 nm and 400 nm.

The waveguide known from document e) is a buried heterostructure waveguide with polarization-independent waveguidance.

The document EP-A-612 129 discloses an integrated optical element on an n-doped substrate of GaAs, whereby a waveguiding layer is arranged between two layers of semiconductor material that adjoin the waveguiding layer and whereof one layer is located between the waveguiding layer and the substrate and is n-doped, whereas the other layer is p-doped.

In this element, the waveguiding layer generally exhibits a crystal lattice constant that is smaller than a specific crystal lattice constant of the GaAs of the substrate.

One exemplary embodiment of this element has the characteristic that each of the layers adjoining the waveguiding layer, whereof one layer is located between the waveguiding layer and the substrate, respectively exhibit a crystal lattice constant that is greater than the crystal lattice constant of the GaAs of the substrate as well as greater than the crystal lattice constant of the waveguiding layer, and that a carrier layer adjoining the substrate and referred to in this document as a buffer layer is arranged between the one layer located between the waveguiding layer and the substrate and adjoining the waveguiding layer and the substrate, said buffer layer being composed of semiconductor material with a crystal lattice constant that, at the substrate, is the same as the specific crystal lattice constant of the GaAs of the substrate and increases from the substrate in the direction toward the one layer adjoining the waveguiding layer, increasing to the greater crystal lattice constant of this one layer. The greater crystal lattice constant is approximately 1% greater than the crystal lattice constant of the substrate.

The carrier layer is separated from the layer adjoining the waveguiding layer by a layer stack that is referred to as super lattice layer in this document, this being composed of two types of extremely thin layers of semiconductor material having a different band gap. The crystal lattice constant of the layer stack is matched to that of the part of the carrier layer lying closest.

SUMMARY OF THE INVENTION

An object of the present invention is to make; and available an integrated optical element which permits polarization-independent waveguidance at a wavelength of 1.55 μm.

A particular advantage of the element according to the invention is that it can be used at the wavelength of 1.55 μm as a polarization-independent optical amplifier and also as a polarization-independent optical modulator or directional coupler or even as a polarization-independent filter.

As a polarization-independent optical amplifier for a wavelength of 1.55 μm, the integrated optical element according to the invention can advantageously be used as a transmit-end booster, as a repeater in a transmission link and as a receiver preamplifier.

In this context, it is to be noted that in the case of waveguides which are known from document b) and c) and which have been successfully implemented for a wavelength of 1.3 μm and which have tensile-strained and compression-strained quantum well layers, at the wavelength of 1.55 μm, only the peripheral parts of the amplification spectrum are still utilized since the tensile strain shifts the wavelength of maximum amplification to shorter wavelengths which lie at approximately 1.50 μm.

Preferred and advantageous refinements of the element according to the invention emerge from the subclaims. In particular, it is apparent from the subclaims that the element according to the invention can also advantageously be implemented as a ribbed waveguide, in particular with a diode structure, whose manufacturing methods provide a high level of reliability and compatibility with previously used manufacturing processes for semiconductor laser diodes.

BRIEF DESCRIPTION OF THE DRAWINGS

FIG. 1 is a perspective, partial view of a first exemplary embodiment of an element according to the invention in the form of a ribbed waveguide with a rib with a constant width, and FIG. 2 is a perspective, partial view of a second exemplary embodiment of an element according to the invention in the form of a ribbed waveguide with a rib which widens in a tapered shape.

DESCRIPTION OF THE PREFERRED EMBODIMENTS

In the case of the integrated optical ribbed waveguide which is illustrated in FIG. 1, a carrier layer 14, which is composed of semiconductor material of the same conductivity type with a crystal lattice constant $a_2$ which varies from a surface 100 of a substrate 10 in the direction of a surface 141 of the layer 14, which surface 141 is remote from the surface 100, is applied to this surface 100 of a substrate 10. The subtrate 10 is composed of semiconductor material comprising InP of a conductivity type, for example n-doped InP.

At or near to the surface 100 of the substrate 10, this varying crystal lattice constant $a_2$ is identical to the specific crystal lattice constant $a_1$ of the InP and as one moves in the direction toward the surface 141 of the carrier layer 14 which is remote from the substrate 10, the crystal lattice constant increases to a crystal lattice constant a, which is less than 1%, preferably essentially 0.5%, higher than the crystal lattice constant $a_1$ of InP. This higher crystal lattice constant a is present at that surface 141 of the carrier layer 14 which is remote from the substrate 10.

According to a preferred embodiment of the element according to the invention which is described later and which has a layer 13 composed of InAsP, the carrier layer 14 can advantageously be composed of InAsP and InP, the composition of the layer changes from the surface 100 of the substrate 10 in the direction of the surface 141 of the carrier layer 14 from the binary InP to the ternary InAsP.

For example, from the surface 100 of the substrate 10 in the direction of the surface 141 of the carrier layer 14, the content of InP decreases gradually from 100% to 0% and that of the InAsP increases gradually from 0% to 100%.

A first layer 13 composed of semiconductor material of the same conductivity type as that of the substrate 10 and of the carrier layer 14 is applied, preferably grown epitaxially, onto that surface 141 of the carrier layer 14 which is remote from the substrate 10. The first layer 13 has, according to the invention, the higher crystal lattice constant a which is of the same magnitude as that present at that surface 141 of the carrier layer 14 which is remote from the substrate 10.

The wave-guiding layer 12 with the specific complex refraction index which can be controlled by electrical charge carriers is applied, for example grown epitaxially, onto a surface 131 of the first layer 13 which is remote from the substrate 10 and the carrier layer 14. This wave-guiding layer 12 has a flat side 122 facing the surface 131 of the layer 13 and a flat side 121 which is remote from the layer 13. Furthermore, the wave-guiding layer has, according to the invention, the higher crystal lattice constant a which is of the same magnitude as that of the layer 13.

A second layer 11 composed of semiconductor material of a conductivity type which is the opposite of the conductivity type of the substrate 10 is applied to the flat side 121, remote from the first layer 13, of the wave-guiding layer 12. The second layer 11 has, according to the invention, the higher crystal lattice constant a which is of the same magnitude as that of the first layer 13 and that of the wave-guiding layer 12.

The first layer 13 forms the semiconductor material of the crystal lattice constant a which, according to the invention, is relatively high, and the semiconductor material is adjacent to the flat side 122, facing the substrate 10 of the wave-guiding layer 12. The second layer 11 forms the semiconductor material of the crystal lattice constant a which, according to the invention, is relatively high, and the semiconductor material is adjacent to the flat side 121, remote from the substrate 10, of the wave-guiding layer 12.

A rib 20 composed of semiconductor material of the same conductivity type as the second layer 11 is applied to a surface 111 of the layer 11 which is remote from the wave-guiding layer 12. In the case of the n-doped substrate 10, the layer 11 and the rib 20 are p-doped.

The rib 20 is arranged on or adjacent the flat side 121, remote from the substrate 10, of the wave-guiding layer 12, but this does not mean that the rib 20 must be in contact with the wave-guiding layer 12. In the example illustrated, the rib 20 is separated from the wave-guiding layer 12 by the layer 11.

The real part or component $n_2$ of the controllable complex refraction index of the wave-guiding layer 12 is greater than a real refraction index $n_1$ of the layer 11 and greater than a real refraction index $n_3$ of the layer 13. The real refraction index $n_1$ of the layer 11 can be equal to the real refraction index $n_3$ of the layer 13. The layers 11 and 13, like the wave-guiding layer 12, can have a complex refraction index. Their real refraction index is then the real part or component of the complex refraction index of these layers 11 and 13.

Light, which is guided in the wave-guiding layer 12 essentially between its flat sides 121 and 122, can be injected into the wave-guiding layer 12, for example through an end face 123, facing the viewer in FIG. 1, of the wave-guiding layer 12, to which the arrow r points.

The complex refraction index of the wave-guiding layer 12 can be controlled by a device for controlling this refraction index by means of charge carriers, so that the intensity I and/or the phase Φ of the light guided in the wave-guiding layer 12 can be varied.

This device for controlling the complex refraction index has an electrical contact 2, which is arranged on a surface 202 of the rib 20 which is remote from the substrate 10 and the wave-guiding layer 12, and an electrical contact 3, which is arranged on an underside 101 of the substrate 10 which is remote from the rib 20 and the wave-guiding layer 12. An electrical control voltage for controlling the complex refraction index n2 can be applied by the contacts 2 and 3.

The rib 20 has a longitudinal axis 201 which is parallel to the flat side 121 and determines a propagation direction of the light guided in the wave-guiding layer. The rib 20 has a specific width b, which restricts the waveguiding of the light being guided in the waveguiding layer 12 essentially to this width b. A height of the rib 20, measured from the surface 111 of the layer 11, is designated by h.

The arrow r is aligned in the direction of the longitudinal axis 201 of the rib 20 and indicates, as already mentioned, the direction of propagation of the light injected into the wave-guiding layer 12 and guided in this layer 12.

The surface 111 of the layer 11 and side faces 203 and 204 of the rib 20 are covered with a layer 21 which is composed of electrically insulating material and to which electrical supply lines for the contact 2 on the rib 20 can be applied.

The carrier layer or the superlattice 14 has the object of "widening" the lattice constant from the lattice constant $a_1$ of the InP of the substrate 10 to the higher lattice constant a, which is less than 1%, preferably essentially 0.5%, higher than the lattice constant $a_1$ of the InP. Since this higher lattice constant a is present at that surface 141 of the carrier layer 14 which is remote from the substrate 10, the layer 13, the wave-guiding layer 12 and the layer 11 may be composed of materials which have essentially the same relatively high lattice constant a. This makes it possible to use for the wave-guiding layer 12 a material which has band edge wavelength which is essentially 0.1 μm greater than that of conventional materials which are applied to InP. It is this shifting of the band edge wavelength by 0.1 μm which makes it possible for the wave-guiding layer 12 to operate at 1.55 μm instead of 1.50 μm.

Preferably ternary material with the lattice constant a, which is higher in comparison with that of InP is used for the layers 13 and 11. In particular, this ternary material is InAsP which has a band edge wavelength of approximately 1.1 μm, in comparison with a band edge wavelength of approximately 0.93 μm of the binary InP.

The wave-guiding layer 12 is preferably composed of a ternary and/or quaternary material with the lattice constant a, which is relatively high in comparison with that of InP. In particular, the layer 12 is $In_{1-y}Ga_yAs$ with a band edge wavelength of essentially 1.75 μm, which corresponds to a fraction y of the Ga atoms in this mixed semiconductor of approximately 0.4. In comparison, in conventional waveguides in which the semiconductor material which is adjacent to the two flat sides and to the wave-guiding layer is composed of InP and the wave-guiding layer is also composed of $In_{1-y}Ga_yAs$, with y being equal to 0.47, this mixed semiconductor has a band edge wavelength of approximately 1.65 μm, which wavelength is 0.1 μm smaller than the band edge wavelength 1.75 μm of the mixed semiconductor according to the invention.

Preferably, the wave-conducting layer 12 has at least one tensile-strained quantum well layer $12_1$. It may also be advantageous if the wave-guiding layer 12 also has a compression-strained quantum well layer $12_2$, in which case it may be favorable if the wave-guiding layer 12 has a plurality of alternate tensile-strained and compression-strained quantum well layers $12_1$ and $12_2$. According to FIGS. 1 and 2, the wave-guiding layer 12 has, by way of example and without restricting the generality, three tensile-strained quantum well layers $12_1$ and two intermediate compression-strained quantum well layers $12_2$.

For a wave-guiding layer 12 with quantum well layers $12_1$ and also $12_2$, the material, contained in this layer 12, with the lowest band edge wavelength may, in turn, be ternary material, for example InAsP with the band edge wavelength 1.1 μm referred to the unstrained state of this material, while the material, contained in this layer, with the greatest band edge wavelength may, in turn, be $In_{1-y}Ga_yAs$ with the band edge wavelength of 1.75 μm referred to the unstrained state of this material.

The wave-guiding layer 12, in particular with one or more quantum well layers, can advantageously be dimensioned in such a way that the optical amplification is independent of a polarization of the injected light.

The exemplary embodiment according to FIG. 2 differs from the exemplary embodiment according to FIG. 1 only in that the width b of the rib 20 widens in a tapered shape along its longitudinal axis 201, preferably in the propagation direction r of the light guided in the wave-guiding layer 12.

Like the example according to FIG. 1, the example according to FIG. 2 may be a polarization-independent semiconductor amplifier with an active wave-guiding layer with polarization-independent amplification. Since, in the example according to FIG. 2, the rib 20 is of tapered shape and the waveguidance is polarization-independent only for narrow ribs, but for wider ribs is polarization-independent in a way similar to a buried heterostructure waveguide, the embodiment according to FIG. 2 is largely polarization-independent. By integrating a microoptics device, which can be composed of a passive waveguide with microoptics, such as a taper, the optical field can again be given a circular cross section, instead of the elliptically widened cross section at the widened end of the rib.

The integrated optical element 1 according to the invention is suitable for optical transmission systems, in particular as an optical amplifier.

I claim:

1. An integrated optical element comprising a substrate of Inp, a waveguiding layer of a specific, complex refractive index being arranged between two layers of semiconductor material each respectively exhibiting a real refractive index ($n_1$, $n_3$) with one layer of the two layers located between the waveguiding layer and the subtrate, the complex refractive index of the waveguiding layer being controllable with electrical charge carriers and exhibits a real part ($n_2$) that is respectively greater than the real refractive index ($n_1$, $n_2$) of the ywo layers adjoining the waveguiding layer so that light of a specific wavelength ($\lambda$) can be coupled into the waveguiding layer and the in-coupled light is guided essentially in the waveguiding layer, said waveguiding layer exhibits a crystal lattice constant (a) that is less than 1 percent greater than a specific crystal lattice constant ($a_1$) of the InP of the subtrate, and means being provided for the control of the complex refractive index in the waveguiding layer so that the intensity (I) and/or phase ($\Phi$) of the light guided in the waveguiding layer the improvement comprising the two layers adjoining the waveguiding layer respectively exhibit a crystal lattice constant (a) that is less than 1 percent greater than the specific crystal lattice constant ($a_1$) of the InP; a carrier layer of semiconductor material being arranged between the subtrate and the one layer that is located between the waveguiding layer and the subtrate, said carrier layer adjoining said one layer and the subtrate, the carrier layer having a crystal lattice constant ($a_2$) that, at or close to the subtrate, is equal to the specific crystal lattice constant ($a_1$) of the InP and increases from the subtrate in the direction toward the one layer adjoining the waveguiding layer to the greater crystal lattice constant said one layer; and the two layer adjoining the waveguiding layer are of a conductivity type (p,n) differing from one another.

2. An element according to claim 1, wherein the one layer which is adjacent to the waveguiding layer is composed of a ternary material.

3. An element according to claim 2, characterized in that the ternary material is composed of InAsP.

4. Am element according to claim 3, wherein the carrier layer is composed of InAsP and InP, wherein the composition changes from the binary InP to the ternary InAsP as one moves from the subtrate in the direction to the one layer.

5. An element according to claim 4, wherein the content of InP decreases gradually in the direction toward the one layer from 100% at the subtrate to 0% at the one layer, and the content of the InAsP increases gradually in the direction toward the one layer from 0% at the subtrate to 100% at the one layer.

6. An element according to claim 3, wherein the waveguiding layer is composed of $In_{1-y}Ga_yAs$, width y being selected to be essentially equal to 0.4.

7. An element according to claim 2, wherein waveguiding layer is composed of a ternary and/or quaternary material.

8. An element according to claim 7, which includes a rib with a longitudinal axis which is parallel to a flat side and determines a propagation direction of the light guided in the wave-guiding layer and the rib has a width which brings about a laterally limited waveguidance in the wave-guiding layer, the wave-guiding layer being dimensioned so that the change, produced by electrical charge carriers, in the intensity (I) and/or phase ($\Phi$) of the light guided in this layer is anisotropic so that said change is greater perpendicular to the flat sides of the waveguiding layer than parallel thereto and is perpendicular to the specific propagation direction, and the rib is dimensioned with respect to the wave-guiding layer so that the waveguidance, brought about by this rib, of the guided light is anisotropic so that the guidance is stronger parallel to the flat sides and perpendicular to the specific propagation direction than perpendicular to the flat sides.

9. An element according to claim 8 wherein the rib widens in a tapered shape along the longitudinal axis.

10. An element according to claim 1 the wave-guiding layer has at least one tensile-strained quantum well layer.

11. An element according to claim 10 wherein the waveguiding layer has alternately tensile-strained and compression-strained quantum well layers.

12. An element according to claim 10, wherein the wave-guiding layer has at least one compression-strained quantum well layer.

13. An element according to claim 1, wherein the waveguiding layer is dimensioned so that the optical amplification is independent of a polarization of the injected light.

14. An element according to claim 1, wherein the crystal lattice constant (a) of the waveguiding layer and each of the two layers is essentially 0.5 percent higher than the crystal lattice constant ($a_1$) of the InP of the subtrate.

* * * * *